United States Patent
Miyamae

(10) Patent No.: US 9,548,729 B2
(45) Date of Patent: Jan. 17, 2017

(54) SWITCHING CIRCUIT

(71) Applicant: Cypress Semiconductor Corporation, San Jose, CA (US)

(72) Inventor: Toru Miyamae, Aichi (JP)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/866,193

(22) Filed: Sep. 25, 2015

(65) Prior Publication Data

US 2016/0373103 A1    Dec. 22, 2016

Related U.S. Application Data

(60) Provisional application No. 62/180,524, filed on Jun. 16, 2015.

(51) Int. Cl.
| | | |
|---|---|---|
| H03B 1/00 | (2006.01) |
| H03K 3/00 | (2006.01) |
| H03K 17/04 | (2006.01) |
| H03K 17/16 | (2006.01) |
| H03K 17/687 | (2006.01) |

(52) U.S. Cl.
CPC .............. *H03K 17/04* (2013.01); *H03K 17/16* (2013.01); *H03K 17/687* (2013.01)

(58) Field of Classification Search
CPC .... H03K 19/00361; H03K 17/16; H04L 27/04
USPC ........ 327/108–112, 427, 434, 437, 379–385; 326/82, 83, 87
See application file for complete search history.

(56) References Cited

U.S. PATENT DOCUMENTS

| | | | |
|---|---|---|---|
| 5,894,241 A * | 4/1999 | Rees ................ | H03K 19/01714 326/27 |
| 6,072,702 A | 6/2000 | Nakao et al. | |
| 6,429,701 B2 * | 8/2002 | Karaki ................ | H03K 17/166 327/110 |
| 6,934,166 B2 | 8/2005 | Vinciarelli | |
| 7,466,111 B2 | 12/2008 | Komaki | |
| 7,495,877 B2 | 2/2009 | Havanur | |
| 7,570,085 B2 * | 8/2009 | Ishikawa .............. | H03K 17/168 327/108 |

(Continued)

FOREIGN PATENT DOCUMENTS

| | | |
|---|---|---|
| EP | 2214298 A1 | 8/2010 |
| EP | 2637297 A2 | 9/2013 |

OTHER PUBLICATIONS

International Search Report for International Application No. PCT/US2016/020449 dated May 17, 2016; 3 pages.

(Continued)

*Primary Examiner* — Lincoln Donovan
*Assistant Examiner* — Thomas Skibinski

(57) ABSTRACT

A switching circuit includes a driver circuit DRV2 that outputs voltage for turning on and off a first transistor switch M2, positioned at a low potential side with respect to a load, among a plurality of transistor switches disposed in series between an input voltage and a ground; and a control circuit that causes the driver circuit DRV2 to output a first voltage that turns the first transistor switch M2 on upon an output voltage of the driver circuit DRV2 rising while the first transistor switch M2 is off and to cause the driver circuit DRV2 to suspend output of the first voltage upon the output voltage of the driver circuit DRV2 dropping after the driver circuit DRV2 outputs the first voltage.

18 Claims, 12 Drawing Sheets

(56) References Cited

U.S. PATENT DOCUMENTS

| | | |
|---|---|---|
| 7,696,731 B2 | 4/2010 | Huang et al. |
| 7,710,187 B2 * | 5/2010 | Hiyama ............... H03K 17/168 326/21 |
| 7,737,761 B2 | 6/2010 | Ishikawa et al. |
| 8,278,897 B2 | 10/2012 | Schiff et al. |
| 8,395,422 B2 | 3/2013 | Ogawa et al. |
| 8,773,099 B2 | 7/2014 | Granger |
| 2008/0048631 A1 | 2/2008 | Kim |
| 2012/0062190 A1 | 3/2012 | Haiplik et al. |
| 2012/0299624 A1 * | 11/2012 | Sugahara ............. H03K 17/168 327/109 |
| 2013/0193937 A1 | 8/2013 | Horie |

OTHER PUBLICATIONS

Williams, Jim, "High Voltage, Low Noise, DC/DC Converters," Linear Technology, Mar. 2008, 48 pages.

Written Opinion of the International Searching Authority for International Application No. PCT/US2016/020449 mailed May 17, 2016; 4 pages.

* cited by examiner

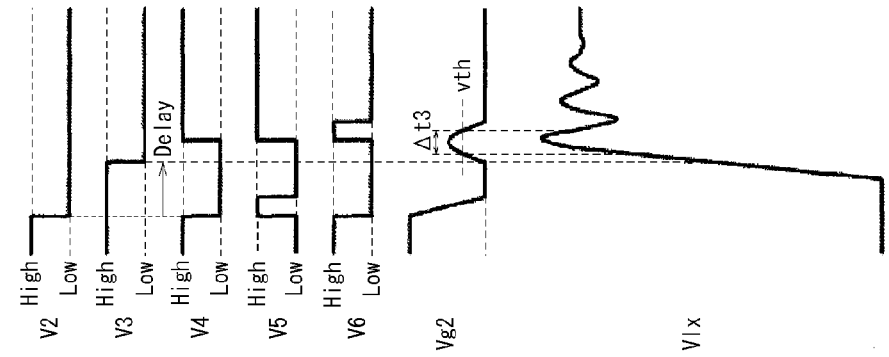
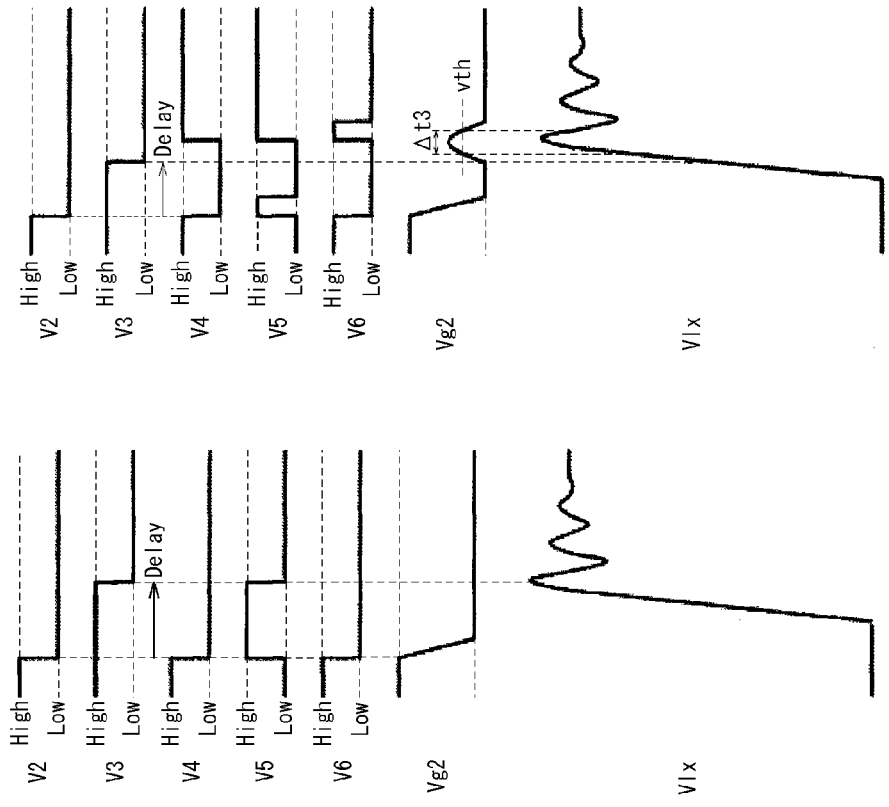
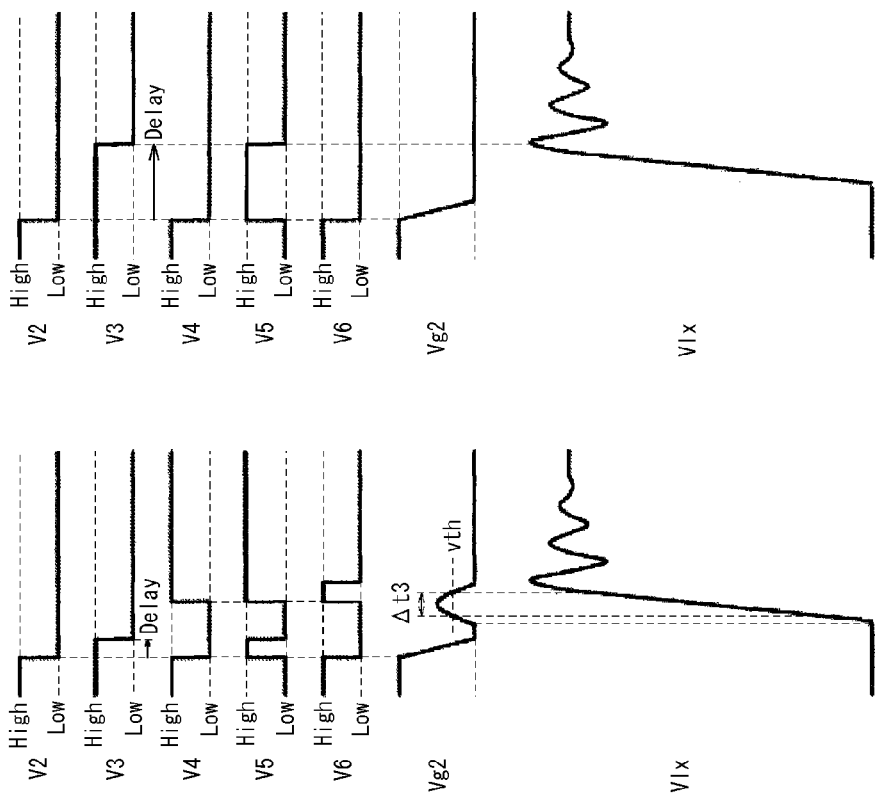

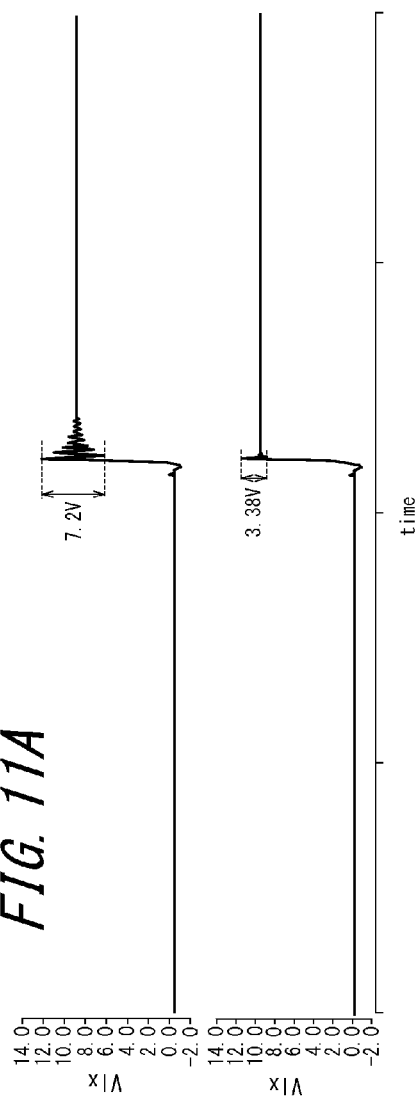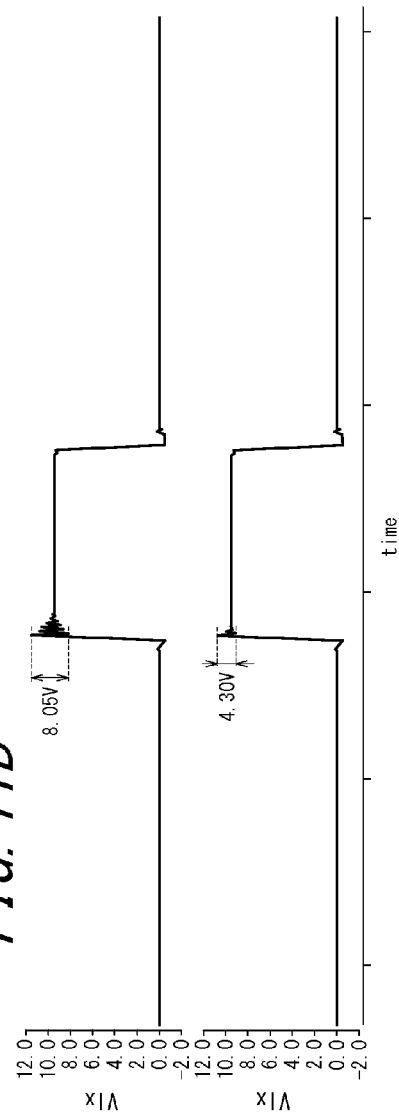

SWITCHING CIRCUIT

PRIORITY

This application claims the priority and benefit of U.S. Provisional Application No. 62/180,524, filed on Jun. 16, 2015, the entire content of which is incorporated by reference herein.

TECHNICAL FIELD

This disclosure relates to a switching circuit.

BACKGROUND

One type of switching circuit is a switching regulator. Switching regulators have high conversion efficiency and are therefore widely used as voltage converters in batteries for inputting voltage to a variety of control circuits (loads). For example, switching regulators are also widely used as on-board power supplies. In switching regulators, however, switching noise occurs during control to switch a switching circuit (MOSFET) on and off.

To address switching noise, one conventional approach uses a noise countermeasure. In greater detail, this conventional approach discloses attenuating resonance energy by turning a plurality of auxiliary switching elements, which each control the conduction current of high-side and low-side switching elements, on for a predetermined time period at a timing that matches the timing at which the switching elements are turned on. The switching elements and the auxiliary switching elements are controlled by corresponding driver circuits. One disadvantage of this conventional approach, however, is that it slows down the switching speed of the regulator.

SUMMARY

This disclosure provides a switching circuit and method of control thereof that attenuate ringing.

An exemplary switching circuit includes: a driver circuit configured to output voltage for turning on and off a first transistor switch, positioned at a low potential side with respect to a load, among a plurality of transistor switches disposed in series between an input voltage and a ground; and a control circuit configured to cause the driver circuit to output a first voltage that turns the first transistor switch on upon an output voltage of the driver circuit rising while the first transistor switch is off and to cause the driver circuit to suspend output of the first voltage upon the output voltage of the driver circuit dropping after the driver circuit outputs the first voltage.

In this exemplary switching circuit, the driver circuit may include a variable resistor, and resistance of the variable resistor changes in response to a signal from the control circuit.

This exemplary switching circuit may further include a delay circuit configured to delay output of the first voltage from the driver circuit to the first transistor switch based on the output voltage of the driver circuit.

In this exemplary switching circuit, when the first transistor switch is on, the driver circuit may decrease the resistance of the variable resistor until the output voltage falls below the first voltage and increase the resistance of the variable resistor upon the output voltage becoming equal to or less than the first voltage.

In this exemplary switching circuit, the first transistor switch may be a MOSFET controlled by voltage supplied to a gate thereof.

The switching circuit according to the following embodiments can attenuate ringing.

BRIEF DESCRIPTION OF THE DRAWINGS

In the accompanying drawings:

FIG. 4 is a circuit diagram illustrating the principle of self turn-on;

FIGS. 10A to 10C illustrate adjustment of delay time in the circuit in FIG. 9;

FIGS. 11A and 11B illustrate attenuation of ringing when using the circuit in FIG. 9.

DETAILED DESCRIPTION

Even if the switching frequency in a switching regulator is, for example, several hundred kHz, ringing corresponding to the switching frequency occurs due to the sudden change in current when switching between on and off. Due to ringing, the wiring and the like of the switching regulator becomes an antenna and radiates noise. As a countermeasure against such noise, the switching frequency in the switching regulator may be lowered to slow down the speed of switching, thereby suppressing the peak of ringing. In this case, however, since the speed of switching is slower, the energy conversion efficiency of the switching regulator may be reduced. Furthermore, if the speed of switching slows down, it becomes impossible in some cases to perform switching at the required switching frequency, for example even when a predetermined speed of switching (such as 2 MHz or more) is required to avoid generation of AM band noise.

In one conventional approach, if a sufficiently long time for the resonance energy to attenuate is set as the time period during which the corresponding auxiliary switching element is turned on in order to limit the conduction current of the low-side switching element when the high-side switching element is turned on, then the current corresponding to this time is wasted. Therefore, as the length of time during which the auxiliary switching element is on grows longer, the efficiency of the switching regulator grows worse. Accordingly, this length of time is preferably short. Shortening this length of time, however, makes it difficult to turn on the auxiliary switching element at a timing matching the timing of ringing.

Figure 1:
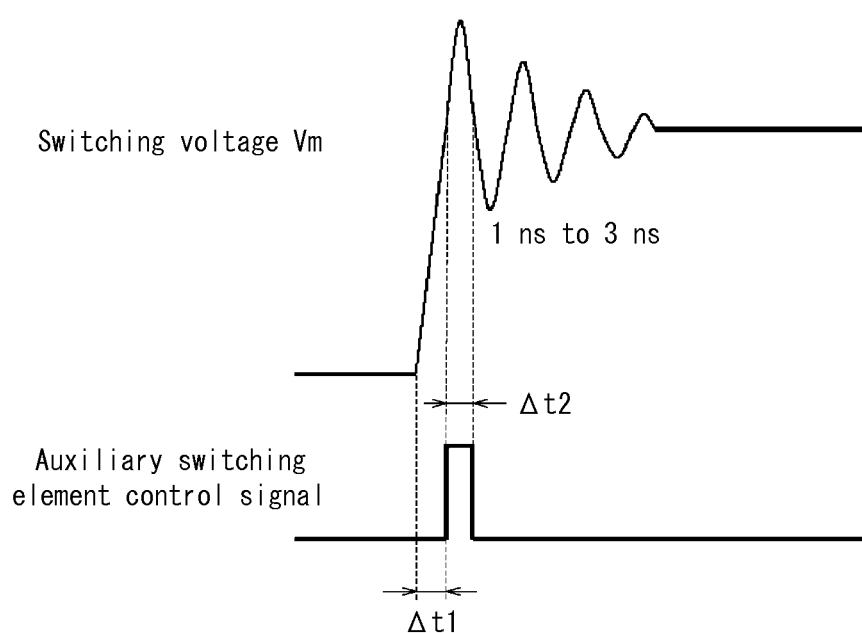
FIG. 1 is a waveform diagram illustrating the relationship between a switching voltage waveform and a control signal that controls an auxiliary switch in an example of a switching regulator.

In the waveform of ringing, the initial peak is the highest, and the ringing gradually attenuates thereafter, as illustrated by the waveform of the switching voltage Vm in FIG. 1. Therefore, if the initial peak of ringing can be attenuated, the subsequent ringing will also be attenuated. Accordingly, the auxiliary switching element in the aforementioned conventional approach is ideally turned on during a time period Δt2 that matches the initial peak of ringing illustrated in FIG. 1. It is difficult, however, to turn the auxiliary switching element on during this appropriate time period Δt2.

Figure 2:
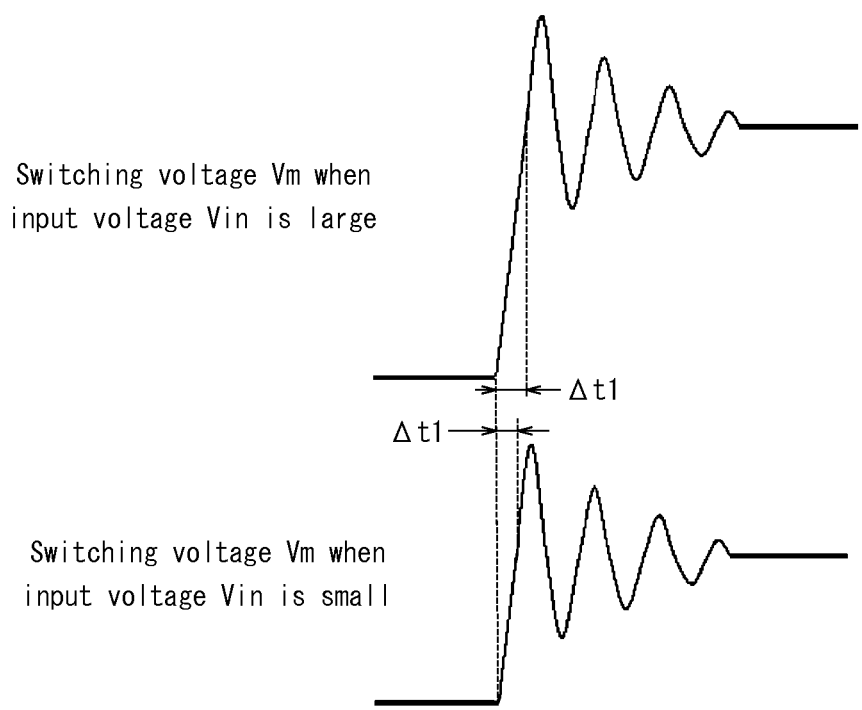
FIG. 2 is a waveform diagram illustrating a change in the switching voltage waveform due to a change in the input voltage.

Even if the auxiliary switching element can be set to turn on during this predetermined time period Δt2, the time period Δt1 from the start of ringing until the auxiliary switching element should be turned on varies, for example when the input voltage varies as illustrated in FIG. 2. Hence, it is difficult to turn the auxiliary switching element on at the preferred timing. Furthermore, when attempting to turn the auxiliary switching element on via control by a driver circuit after detecting a change in the switching voltage Vm, it is difficult to turn the switching element on at an appropriate timing due to the delay from detection of the change in the switching voltage Vm until the auxiliary switching element turns on.

Embodiments for taking a countermeasure against noise without reducing the speed of switching are described below with reference to the drawings.

Embodiment 1

Figure 3:
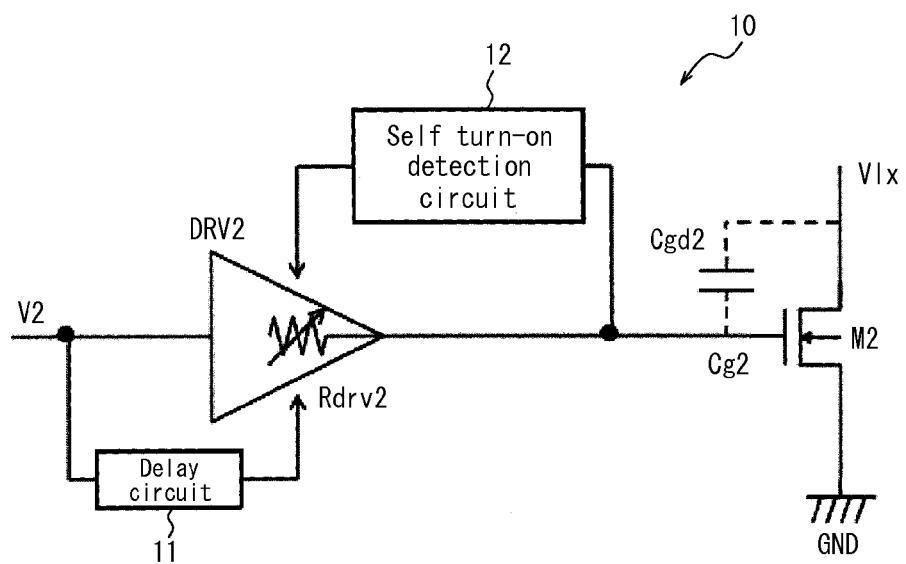
FIG. 3 is a functional block diagram schematically illustrating a switching circuit according to Embodiment 1.

FIG. 3 is a block diagram of a switching circuit according to Embodiment 1. This switching circuit is, for example, used in a DC-DC converter that temporally divides input voltage by controlling high-side and low-side transistor switches with respect to a load, smooths the temporally divided input voltage, and outputs the result. A switching circuit 10 is provided with a driver circuit DRV2, a delay circuit 11, and a self turn-on detection circuit 12. The driver circuit DRV2 includes an output resistor Rdrv2 that is a variable resistor. A low-side transistor switch M2 is controlled to be on or off by output of the driver circuit DRV2. Via self turn-on, the switching circuit 10 causes the timing at which ringing occurs and the timing at which current flows to the ground (GND) to match.

Figure 4:
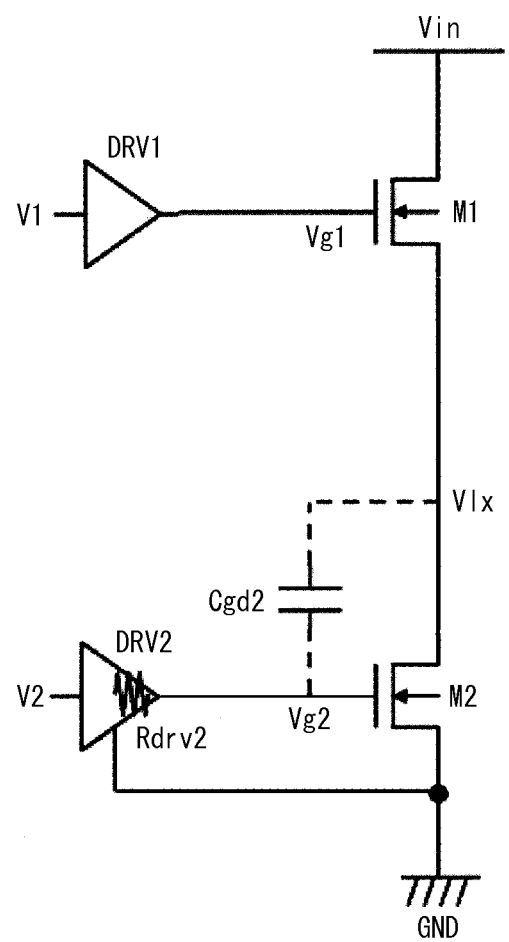

With reference to FIG. 4, the principle of self turn-on in the switching circuit of FIG. 3 is now described. In FIG. 4, structural elements that are the same as the structural elements in the circuit in FIG. 3 are labeled with the same reference signs. The circuit in FIG. 4 includes driver circuits DRV1 and DRV2 and transistor switches M1 and M2 that, for example, are MOSFETs or the like. Input voltage Vin is supplied to the drain of the transistor switch M1. The source of the transistor switch M1 is connected to the source of the transistor switch M2. The drain of the transistor switch M2 is connected to the ground GND. The outputs of the driver circuit DRV1 and the driver circuit DRV2 are respectively provided to the gate terminals of the transistor switch M1 and the transistor switch M2. The driver circuit DRV2 is also connected to the ground GND.

The driver circuit DRV1 outputs a driver output voltage Vg1 upon input of an input voltage V1. The driver circuit DRV2 outputs a driver output voltage Vg2 upon input of an input voltage V2. Here, the transistor switches M1 and M2 are respectively high-side and low-side switches. The voltage Vlx is an output voltage provided to a non-illustrated load.

The driver circuit DRV2 includes an output resistor Rdrv2. The driver circuit DRV2 corresponds to the driver circuit DRV2 illustrated in FIG. 3. As the resistance of the output resistor Rdrv2 is larger, a parasitic capacitance Cgd2 occurs between the drain and the gate of the transistor M2.

Figure 5:
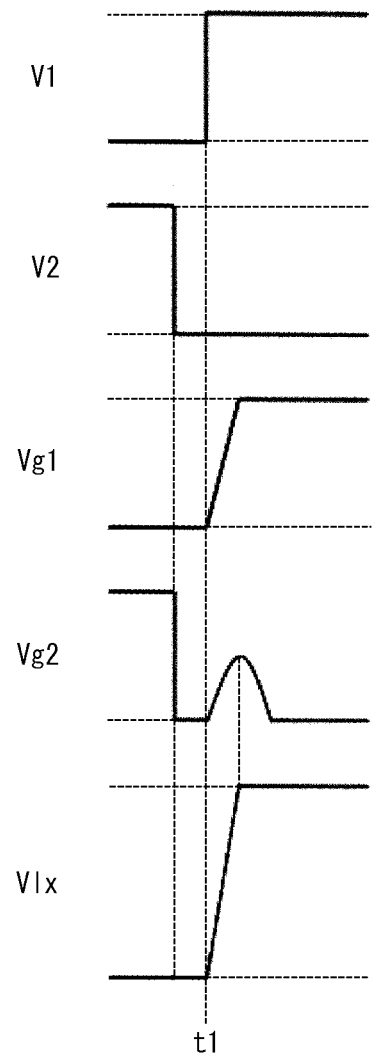
FIG. 5 is a waveform diagram illustrating the relationship between voltages in the circuit in FIG. 4.

FIG. 5 is a waveform diagram illustrating the relationship between the voltages V1, V2, Vg1, Vg2, and Vlx in the circuit in FIG. 4. At time t1 illustrated in FIG. 5, the transistor switch M1 changes from off to on and begins to conduct, at which point the voltage Vlx rises. At this time, if the resistance of the output resistor Rdrv2 in the driver circuit DRV2 has a certain value, then due to the increase in the voltage Vlx, the voltage Vg2 increases through the parasitic capacitance Cgd2. As a result, the transistor switch M2 turns on regardless of the output of the driver circuit DRV2, and current flows to the ground. This phenomenon by which the transistor switch M2 turns on based on a change in the voltage Vlx is referred to as self turn-on. The switching circuit 10 of this embodiment uses this self turn-on to cause the timing at which ringing occurs and the timing at which current flows to the ground (GND) to match.

FIG. 3 further illustrates how the same input voltage V2 as the voltage that is input into the driver circuit DRV2 is also input into the delay circuit 11. The delay circuit 11 then outputs the input voltage V2 as output voltage after delaying a predetermined length of time. The output voltage output by the delay circuit 11 is provided to the driver circuit DRV2. The self turn-on detection circuit 12 detects whether, at the output side of the driver circuit DRV2, self turn-on has occurred in the transistor switch M2. The self turn-on detection circuit 12 corresponds to the "control circuit" in this embodiment. In greater detail, the self turn-on detection circuit 12 detects whether self turn-on has occurred in the transistor switch M2 due to a change in the signal at the gate of the transistor switch M2.

Figure 6:
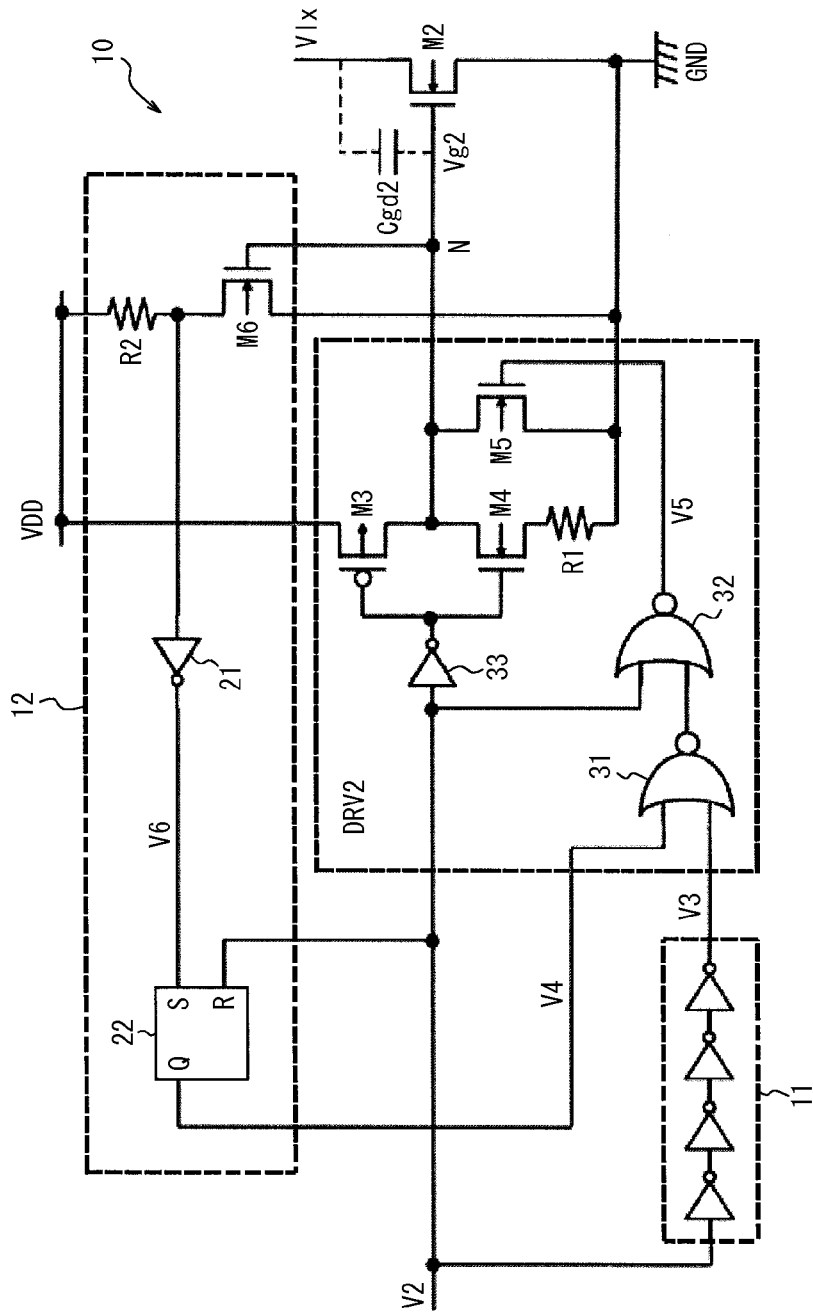
FIG. 6 illustrates an example of the structure of a switching circuit according to Embodiment 1.

FIG. 6 illustrates an example of a switching circuit according to Embodiment 1.

The driver circuit DRV2 includes NOR circuits 31 and 32, a NOT circuit 33, transistor switches M3, M4, and M5, and a resistor R1. In this embodiment, the transistor switch M3 is a p-type MOSFET, and the transistor switches M4 and M5 are n-type MOSFETs.

Voltage V3 output by the delay circuit 11 and voltage V4 output by the self turn-on detection circuit 12 are provided to the NOR circuit 31. The NOR circuit 31 inverts the logical sum of the signals indicated by the input voltages V3 and V4 and outputs the result.

The voltage output by the NOR circuit 31 and the voltage V2 that is input into the driver circuit DRV2 are provided to the NOR circuit 32. The NOR circuit 32 inverts the logical sum of the signals indicated by the input voltages and outputs the result (voltage V5).

The voltage V2 input into the driver circuit DRV2 is inverted at the NOT circuit 33 and provided to the gate of the transistor switch M3. The source of the transistor switch M3 is connected to a power source VDD. The drain of the transistor switch M3 is connected to the drain of the transistor switch M4 and to the drain of the transistor switch M5.

The voltage V2 input into the driver circuit DRV2 is inverted at the NOT circuit 33 and provided to the gate of the transistor switch M4. The source of the transistor switch M4 is connected to the ground GND via the resistor R1.

The voltage V5 output by the NOR circuit 32 is input into the gate of the transistor switch M5. The source of the transistor switch M5 is connected to the ground GND.

In the driver circuit DRV2 with the above-described structure, the output resistor Rdrv2 is subjected to variable control by controlling the transistor switches M3, M4, and M5 to turn on or off. In other words, the magnitude of voltage drop due to the resistor R1 with respect to the output voltage in the node N is changed between a state in which the transistor switches M3, M4, and M5 are all conducting and a state in which the transistor switches M3 and M4 are conducting while the transistor switch M5 is not conducting. When the resistance of the output resistor Rdrv2 is less than a certain value, then self turn-on does not occur, whereas when the resistance of the output resistor Rdrv2 is at least a certain value, self turn-on does occur. The state in which self turn-on occurs is referred to below as a self turn-on state, and the state in which self turn-on does not occur is referred to as a non-self turn-on state. Whether or not self turn-on occurs in the driver circuit DRV2 is described below.

As illustrated in FIG. 6, the delay circuit 11 is configured with a plurality of NOT circuits connected in series.

The self turn-on detection circuit 12 includes a transistor switch M6, a resistor R2, a NOT circuit 21, and a latch circuit 22. The voltage of the node N between the driver circuit DRV2 and the transistor switch M2 is input into the gate of the transistor switch M6. The drain of the transistor switch M6 is connected to a power source VDD via the resistor R2, and the drain is connected to the ground GND.

The NOT circuit 21 is connected to the power source VDD via the resistor R2. The NOT circuit 21 outputs a signal (voltage V6) that is the inversion of the signal indicated by the power source voltage.

The latch circuit 22 is a so-called SR latch circuit. The voltage V6 output by the NOT circuit 21 is input into the S input port of the latch circuit 22. The same input voltage V2 as the voltage that is input into the driver circuit DRV2 is input into the input port R of the latch circuit 22. The latch circuit 22 outputs a signal (voltage V4) from the output port Q. The voltage V4 that is output is then input into the NOR circuit 31 of the driver circuit DRV2.

Figure 7:
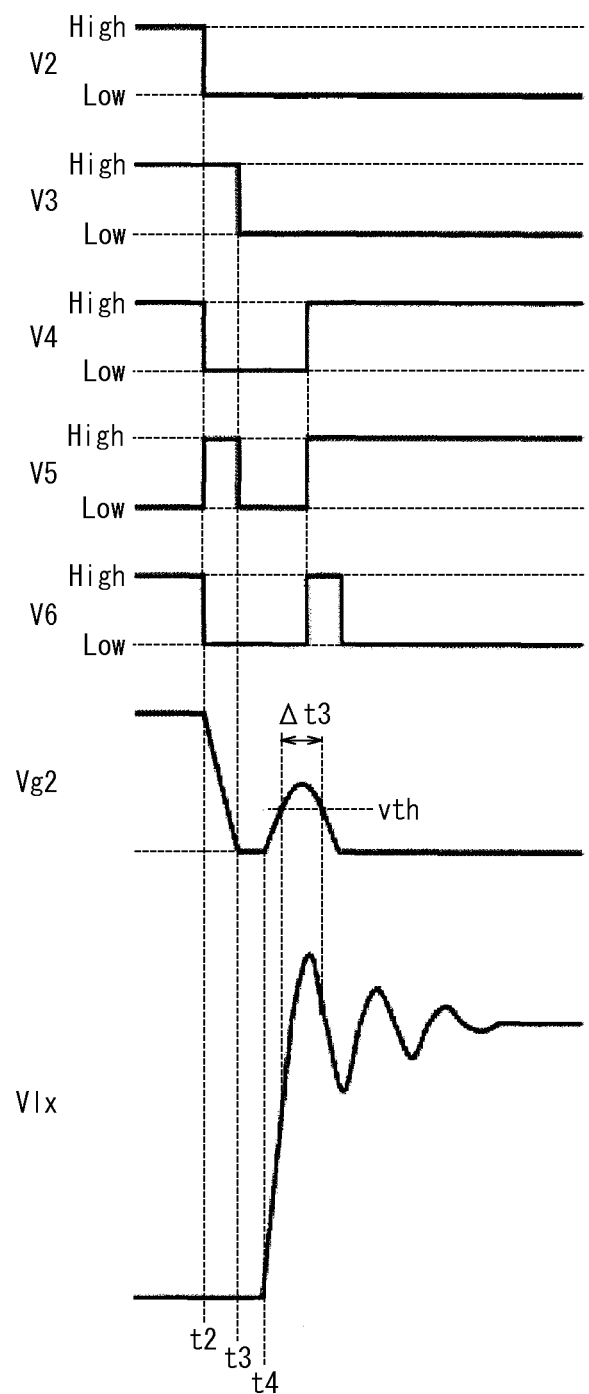
FIG. 7 is a waveform diagram illustrating the relationship between voltages in the circuit in FIG. 6.

FIG. 7 is a waveform diagram illustrating the relationship between the voltages V2, V3, V4, V5, V6, Vg2, and Vlx in the circuit in FIG. 6. With reference to FIG. 7, the following provides a detailed description of operations in the driver circuit DRV2 to switch between the non-self turn-on state and the self turn-on state and of the occurrence of self turn-on.

At the start point of the waveform diagram in FIG. 7, the driver circuit DRV2 is in the non-self turn-on state. Once the voltage V2 changes from High to Low at time t2, the voltage Vg2 output by the driver circuit DRV2 also lowers over a predetermined delay time due to the delay circuit 11. The predetermined delay time that it takes for the voltage Vg2 to change from High to Low is also referred to below as a "transition period". The transition period is, for example, 0.5 ns. Once the transition period elapses after time t2, the voltage V5 output by the NOR circuit 32 changes from High to Low at time t3. As a result, the value of the output resistor Rdrv2 of the driver circuit DRV2 increases. In other words, at this time, the driver circuit DRV2 switches from the non-self turn-on state to the self turn-on state.

In this state, once the voltage Vlx suddenly rises at time t4, the voltage Vg2 temporarily rises as per the principle described with reference to FIGS. 4 and 5. When the voltage Vg2 rises in this way, self turn-on occurs. When self turn-on occurs, the voltage Vg2 exceeds a predetermined threshold vth. By self turn-on, the noise of the voltage Vlx can be attenuated.

The voltage Vg2 that started to rise at time t4 is input into the self turn-on detection circuit 12. In the self turn-on detection circuit 12, the transistor switch M6 is configured to conduct upon input into the gate of a voltage Vg2 exceeding the predetermined threshold vth. The transistor switch M6 enters a conducting state when the voltage Vg2 is the threshold vth or more and a non-conducting state when the voltage Vg2 is less than the threshold vth. By conduction of the transistor switch M6, the self turn-on detection circuit 12 detects the self turn-on state. Conversely, by non-conduction of the transistor switch M6, the self turn-on detection circuit 12 detects the non-self turn-on state. Once the non-self turn-on state is entered, the voltage V6 input into the latch circuit 22 changes from Low to High. As a result, the voltage V4 output by the latch circuit 22 changes from Low to High.

Once the voltage V4 that has changed to High is input into the NOR circuit 31, the voltage V5 output by the NOR circuit 32 changes from Low to High. By the voltage V5 that has become High being input into the gate of the transistor switch M5, the transistor switch M5 turns on. As a result, the value of the output resistor Rdrv2 of the driver circuit DRV2 lowers. Hence, the driver circuit DRV2 switches from the self turn-on state to the non-self turn-on state.

The time Δt3 that self turn-on continues is determined by the delay in the circuit that detects the self turn-on. The time Δt3 that self turn-on continues is, for example, 3 ns. Once the time Δt3 elapses and the voltage Vg2 falls below the threshold vth, the transistor switch M6 enters a non-conducting state.

Figure 8:
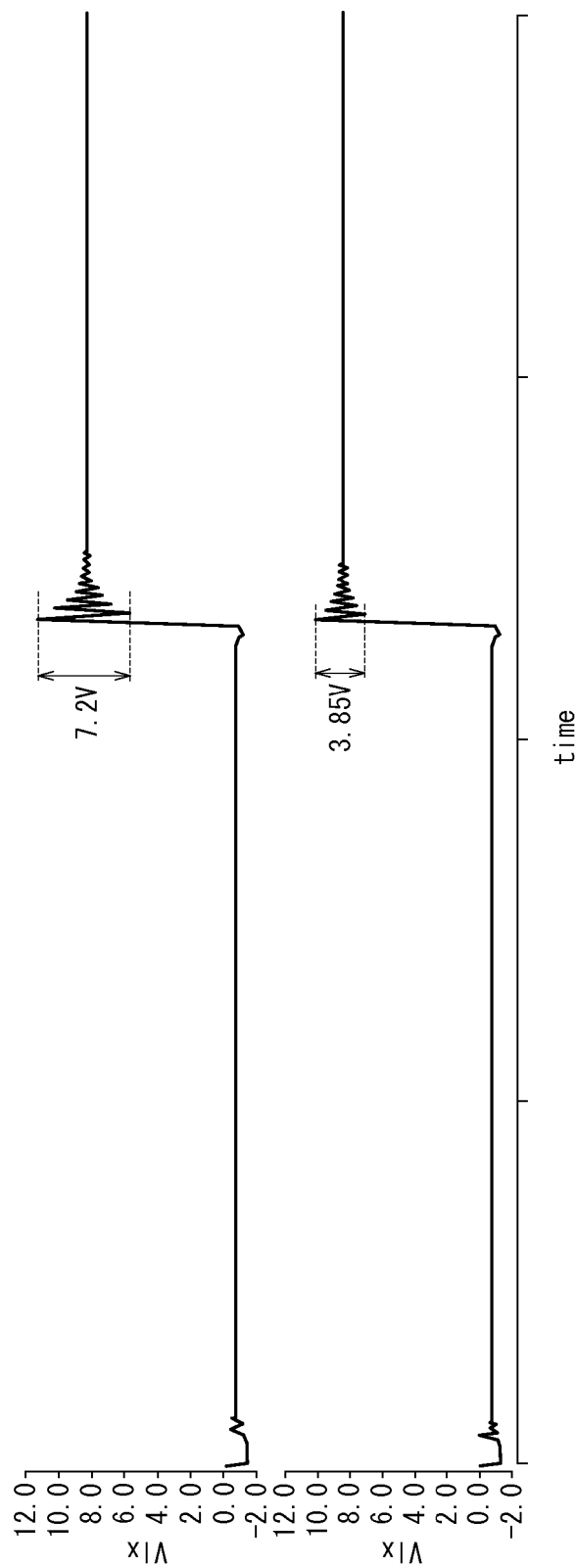
FIG. 8 illustrates attenuation of ringing when using the circuit in FIG. 6.

FIG. 8 illustrates attenuation of ringing when using the circuit in FIG. 6. The graph in the upper tier of FIG. 8 illustrates the change in switching voltage when not using the switching circuit 10 according to this embodiment, and the graph in the lower tier of FIG. 8 illustrates the change in switching voltage when using the switching circuit 10 according to this embodiment. The graphs in FIG. 8 illustrate the experimental results for an input voltage Vin of 12 V. As illustrated in FIG. 8, when using the switching circuit 10 according to this embodiment, ringing is attenuated as compared to when not using the switching circuit 10.

Embodiment 2

Figure 9:
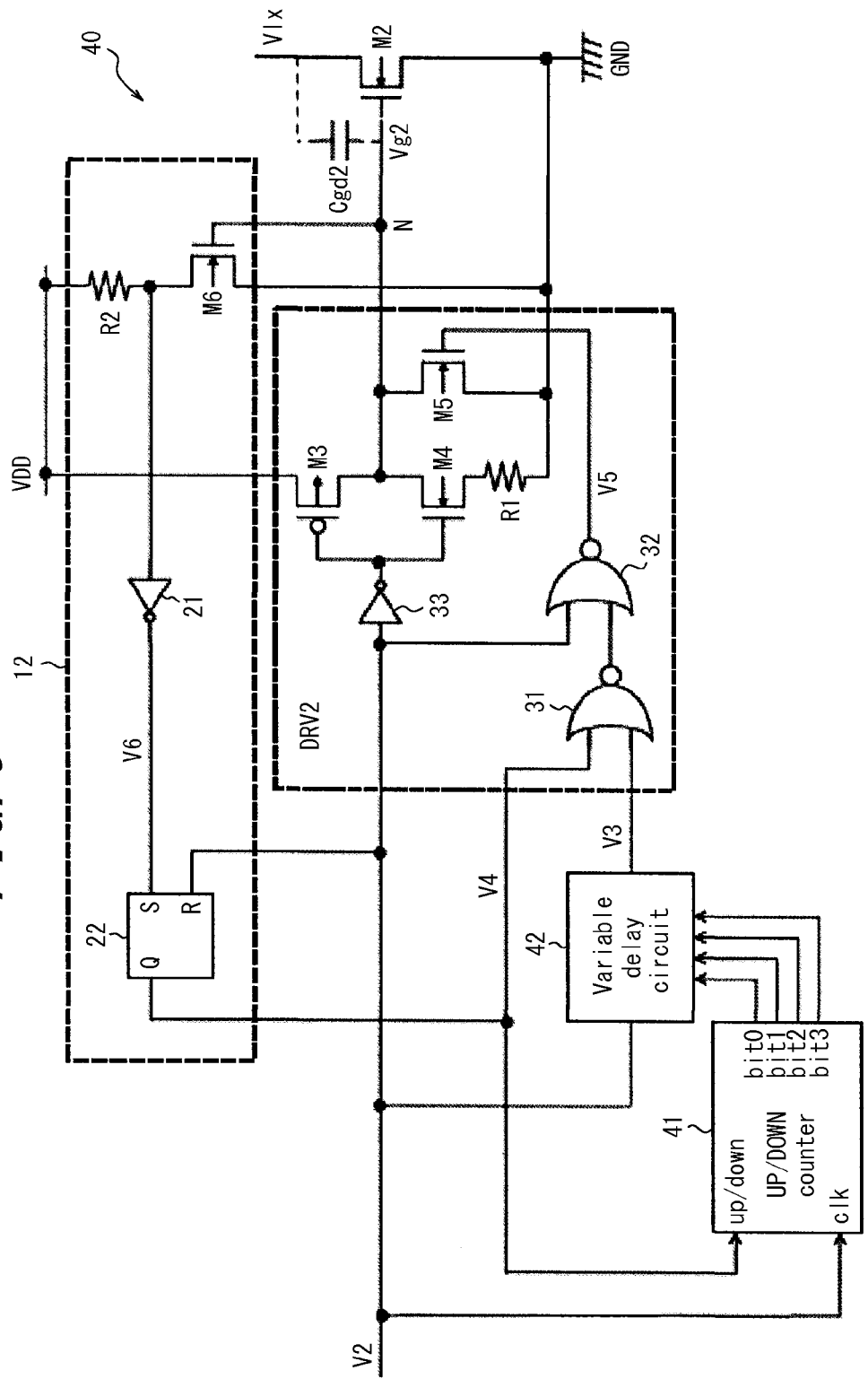
FIG. 9 illustrates an example of the structure of a switching circuit according to Embodiment 2.

FIG. 9 illustrates an example of a switching circuit according to Embodiment 2. As compared to the switching circuit 10 according to Embodiment 1, a switching circuit 40 according to Embodiment 2 can cause the timing at which self turn-on occurs to match the timing of ringing with even higher accuracy. A description of portions of the switching circuit 40 according to Embodiment 2 that are the same as the switching circuit 10 according to Embodiment 1 is omitted, so as to focus on the differences. In the switching circuit 40 according to Embodiment 2, structural elements that are the same as those of the switching circuit 10 according to Embodiment 1 are labeled with the same reference signs.

The switching circuit 40 according to Embodiment 2 differs from the switching circuit 10 according to Embodiment 1 by not including the delay circuit 11 and by including an Up/Down counter 41 and a variable delay circuit 42.

The input voltage V2 is input into the variable delay circuit 42, and the variable delay circuit 42 delays the input voltage by a predetermined length of time and outputs the result as output voltage V3. The output voltage V3 that is output by the variable delay circuit 42 is provided to the NOR circuit 31 of the driver circuit DRV2. The predetermined length of time (delay time) by which the variable delay circuit 42 delays the input voltage V2 is determined based on a control signal provided by the Up/Down counter 41. The variable delay circuit 42 for example determines the delay time to be within a range of 1.2 ns to 6.0 ns, in increments of 0.3 ns.

The input voltage V2 and the voltage V4 output by the latch circuit 22 of the self turn-on detection circuit 12 are input into the Up/Down counter 41. Based on the input voltages V2 and V4, the Up/Down counter 41 transmits, to the variable delay circuit 42, a control signal for adjusting (changing) the delay time in the variable delay circuit 42. For example, when the self turn-on detection circuit 12 detects self turn-on, the signal indicated by the voltage V4 becomes High, since the transistor switch M6 is in a conducting state. At this time, the Up/Down counter 41 outputs a control signal for delaying the variable delay circuit 42 by one step to the variable delay circuit 42. Conversely, when the self turn-on detection circuit 12 detects non-self turn-on, the signal indicated by the voltage V4 becomes Low, since the transistor switch M6 is in a non-conducting state. At this time, the Up/Down counter 41 outputs a control signal for accelerating the variable delay circuit 42 by one step to the variable delay circuit 42.

Based on the signal V3 provided by the variable delay circuit 42, the driver circuit DRV2 controls the timing at which self turn-on is produced in the transistor switch M2.

With reference to FIGS. 10A to 10C, adjustment of the delay time by the Up/Down counter 41 and the variable delay circuit 42 and the timing of when self turn-on occurs are now described. FIGS. 10A to 10C illustrate the relationship between the voltages V2, V3, V4, V5, V6, Vg2, and Vlx in the circuit in FIG. 9. If the delay time is too short, then as illustrated in FIG. 10A, self turn-on occurs earlier than the timing of the initial peak of ringing. Hence, ringing cannot be sufficiently attenuated. Therefore, in order to match the timing of self turn-on with the timing of ringing, when the self turn-on detection circuit 12 detects self turn-on (self turn-on state), the variable delay circuit 42 increases the delay time by one step (i.e. 0.3 ns) based on the control signal provided by the Up/Down counter 41. In other words, when self turn-on occurs in the transistor switch M2, the variable delay circuit 42 extends the delay time by 0.3 ns. The timing at which self turn-on occurs can thus be delayed.

Conversely, when the delay time is too long, then as illustrated in FIG. 10B, self turn-on does not occur (non-self turn-on state) even though ringing is occurring. Therefore, in order to match the timing of self turn-on with the timing of ringing, when the self turn-on detection circuit 12 does not detect self turn-on of the transistor switch M2, the variable delay circuit 42 decreases the delay time by one step (i.e. 0.3 ns) based on the control signal provided by the Up/Down counter 41. In other words, when self turn-on does not occur in the transistor switch M2, the variable delay circuit 42 shortens the delay time by 0.3 ns. The timing at which self turn-on occurs can thus be accelerated.

As illustrated in FIG. 10C, by repeating the above control, the variable delay circuit 42 adjusts the timing at which self turn-on occurs so as to match the timing of the initial peak of ringing. Hence, the switching circuit 40 according to Embodiment 2 can cause the timing at which self turn-on occurs to match the timing of ringing with even higher accuracy.

FIGS. 11A and 11B illustrate attenuation of ringing when using the circuit in FIG. 9. The graphs in the upper tiers of FIGS. 11A and 11B illustrate the change in switching voltage when not using the switching circuit 40 according to this embodiment, and the graphs in the lower tiers of FIGS. 11A and 11B illustrate the change in switching voltage when using the switching circuit 40 according to this embodiment. The graphs in FIG. 11A illustrate the experimental results for an input voltage Vin of 12 V, and the graphs in FIG. 11B illustrate the experimental results for an input voltage Vin of 24 V. As illustrated in FIG. 11A, when using the switching circuit 40 according to this embodiment, ringing is attenuated as compared to when not using the switching circuit 40. Furthermore, as illustrated in FIG. 11B, ringing is attenuated even if the input voltage changes and the timing of ringing changes, since self turn-on occurs in conjunction with the timing of ringing by using the switching circuit 40 according to this embodiment.

Figure 12:
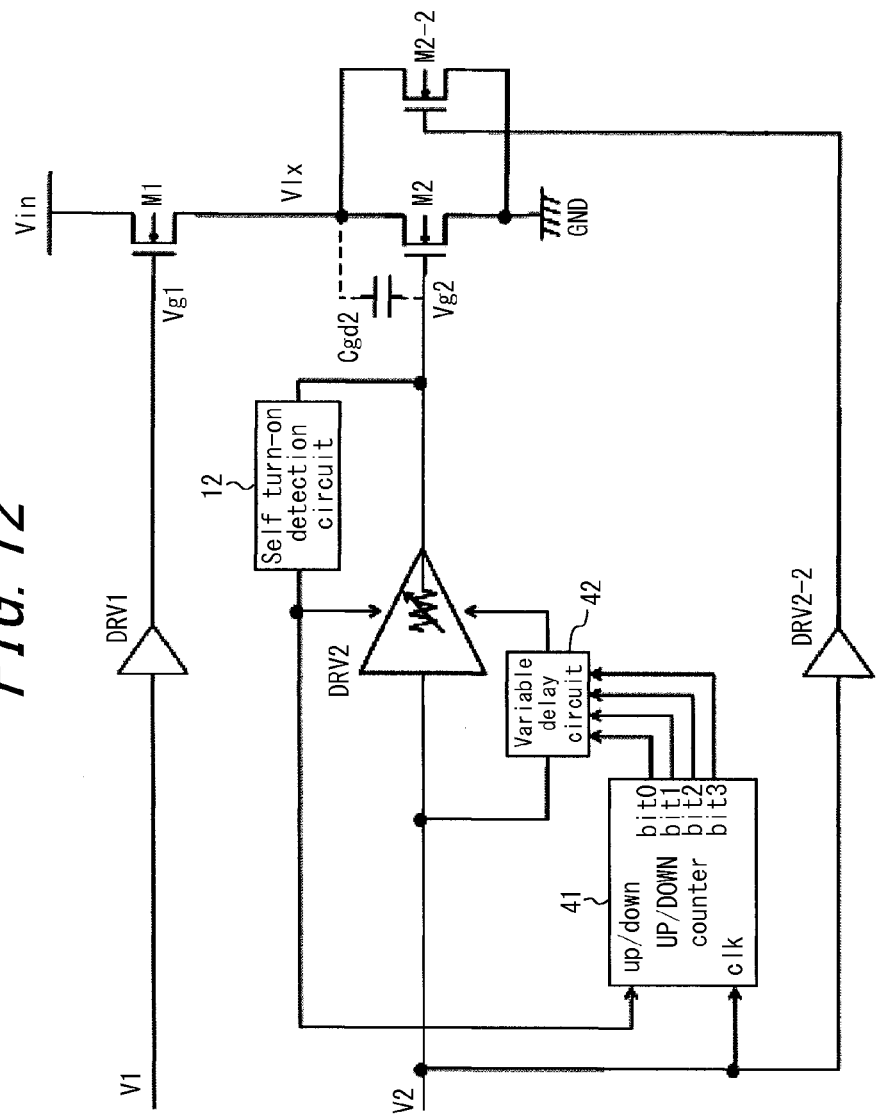
FIG. 12 illustrates a modification to Embodiment 2.

FIG. 12 illustrates a modification to this embodiment. To the structure in FIG. 9, this modification adds an auxiliary switch M2-2 for the transistor switch M2 and an auxiliary driver circuit DRV2-2 that performs on/off control of the auxiliary switch M2-2. In this modification, while the transistor switch M2 is in a non-conducting state, the input voltage to the driver circuit DRV2 is Low, and therefore auxiliary switch M2-2 is also in a non-conducting state. Accordingly, for example a comparison with a structure that includes an auxiliary switch such as PTL 1 shows that although it is difficult with only an auxiliary switch to maintain a good conversion efficiency while suppressing ringing, it is possible to suppress ringing at an appropriate timing by combining a structure that includes an auxiliary switch with the structure of this embodiment.

Although exemplary embodiments have been described with reference to the accompanying drawings, it is to be noted that various changes and modifications will be apparent to those skilled in the art based on this disclosure. Therefore, such changes and modifications are to be understood as included within the scope of this disclosure. For example, the functions and the like included in each component may be reordered in any logically consistent way. Furthermore, structural components and the like may be combined into one or divided.

The invention claimed is:

1. A switching circuit comprising:
    a driver circuit configured to output voltage for turning on and off a first transistor switch, positioned at a low potential side with respect to a load, among a plurality of transistor switches disposed in series between an input voltage and a ground;
    a control circuit configured to cause the driver circuit to output a first voltage that turns the first transistor switch on upon an output voltage of the driver circuit rising while the first transistor switch is off and to cause the driver circuit to suspend output of the first voltage upon the output voltage of the driver circuit dropping after the driver circuit outputs the first voltage; and
    an up/down counter and a variable delay circuit, wherein an output of the up/down counter is coupled to an input of the variable delay circuit, and an output of the variable delay circuit is coupled to an input of the driver circuit.

2. The switching circuit of claim 1, wherein the driver circuit includes a variable resistor, and resistance of the variable resistor changes in response to a signal from the control circuit.

3. The switching circuit of claim 2, wherein when the first transistor switch is on, the driver circuit decreases the resistance of the variable resistor until the output voltage falls below the first voltage and increases the resistance of the variable resistor upon the output voltage becoming equal to or less than the first voltage.

4. The switching circuit of claim 1, wherein the variable delay circuit is configured to delay output of the first voltage, from the driver circuit to the first transistor switch, based on the output voltage of the driver circuit.

5. The switching circuit of claim 1, wherein the first transistor switch is a metal-oxide-semiconductor field-effect transistor (MOSFET) controlled by voltage supplied to a gate thereof.

6. The switching circuit of claim 1, further comprising:
an auxiliary switch coupled in parallel with the first transistor switch at the low potential side with respect to the load; and
an auxiliary driver circuit configured to output voltage for turning on and off the auxiliary switch.

7. The switching circuit of claim 1, further comprising:
a second transistor switch, positioned at a high potential side with respect to the load, among the plurality of transistor switches disposed in series between the input voltage and the ground; and
a high-side driver circuit configured to output voltage for turning on and off the second transistor switch.

8. The switching circuit of claim 7, further comprising an output node between the second transistor switch and the first transistor switch, wherein an output load voltage at the output node is provided to the load.

9. The switching circuit of claim 1, wherein an output load voltage of the switching circuit is coupled to the load in a switching regulator.

10. A method of attenuating ringing in a switching circuit, the method comprising:
causing a driver circuit, of the switching circuit, to output a first voltage that turns a first transistor switch on upon an output voltage of the driver circuit rising while the first transistor switch is off;
wherein the first transistor switch, among a plurality of transistor switches disposed in series between an input voltage and a ground, is positioned at a low potential side with respect to a load;
causing the driver circuit to suspend output of the first voltage upon the output voltage of the driver circuit dropping after the driver circuit outputs the first voltage; and
using an up/down counter coupled to a variable delay circuit to delay output of the first voltage.

11. The method of claim 10, further comprising:
detecting a self turn-on state and a non-self turn-on state of the driver circuit; and
changing resistance of a variable resistor of the driver circuit in response to detecting the self turn-on state or the non-self turn state.

12. The method of claim 11, further comprising increasing the resistance of the variable resistor in response to the driver circuit switching from the non-self turn-on state to the self turn-on state.

13. The method of claim 11, further comprising decreasing the resistance of the variable resistor in response to the driver circuit switching from the self turn-on state to the non-self turn-on state.

14. The method of claim 10, further comprising matching a timing at which ringing occurs in the switching circuit with a timing at which current flows to the ground.

15. The method of claim 10, further comprising delaying output of the first voltage, from the driver circuit to the first transistor switch, based on the output voltage of the driver circuit.

16. An apparatus comprising:
a load; and
a switching regulator coupled to provide voltage to the load, the switching regulator comprising:
a driver circuit configured to output voltage for turning on and off a first transistor switch, positioned at a low potential side with respect to the load, among a plurality of transistor switches disposed in series between an input voltage and a ground;
a control circuit configured to cause the driver circuit to output a first voltage that turns the first transistor switch on upon an output voltage of the driver circuit rising while the first transistor switch is off and to cause the driver circuit to suspend output of the first voltage upon the output voltage of the driver circuit dropping after the driver circuit outputs the first voltage; and
an up/down counter and a variable delay circuit, wherein an output of the up/down counter is coupled to an input of the variable delay circuit, and an output of the variable delay circuit is coupled to an input of the driver circuit.

17. The apparatus of claim 16, wherein the load is a control circuit.

18. The apparatus of claim 16, wherein the switching regulator is configured as an on-board power supply.

* * * * *